(12) United States Patent
Cai et al.

(10) Patent No.: US 8,516,694 B2
(45) Date of Patent: Aug. 27, 2013

(54) METHOD FOR MANUFACTURING PRINTED CIRCUIT BOARD WITH CAVITY

(75) Inventors: Xue-Jun Cai, Shenzhen (CN); Zhi-Yong Li, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 314 days.

(21) Appl. No.: 13/091,152

(22) Filed: Apr. 21, 2011

(65) Prior Publication Data
US 2011/0297644 A1 Dec. 8, 2011

(30) Foreign Application Priority Data
Jun. 7, 2010 (CN) .......................... 2010 0 193434

(51) Int. Cl.
*H01K 3/10* (2006.01)
(52) U.S. Cl.
USPC .................... 29/852; 29/829; 29/830; 29/846
(58) Field of Classification Search
USPC .................. 29/852, 829, 830, 832, 834, 842, 29/846
See application file for complete search history.

(56) References Cited

U.S. PATENT DOCUMENTS
8,186,046 B2 * 5/2012 Tanaka ........................... 29/832

FOREIGN PATENT DOCUMENTS
TW 200942095 A 10/2009
TW 200945969 A 11/2009
TW 201023312 * 6/2010

* cited by examiner

*Primary Examiner* — Thiem Phan
(74) *Attorney, Agent, or Firm* — Altis Law Group, Inc.

(57) ABSTRACT

A method for manufacturing printed circuit board includes steps below. An inner substrate including a first electrically conductive layer is provided. A first electrically conductive pattern is formed in the first electrically conductive layer. The first electrically conductive pattern includes an exposed region and an attaching region. A protective layer is formed on the entire exposed region. A first adhesive layer and a second electrically conductive layer are laminated on a surface of the first electrically conductive pattern in the attaching region and a surface of the protective layer. A slit along a boundary of the exposed region passing through the second electrically conductive pattern and the first adhesive layer is defined. The second electrically conductive layer corresponding to the exposed region, the first adhesive layer corresponding to the exposed region and the protective layer is removed.

10 Claims, 9 Drawing Sheets

METHOD FOR MANUFACTURING PRINTED CIRCUIT BOARD WITH CAVITY

BACKGROUND

1. Technical Field

The present disclosure generally relates to printed circuit boards (PCBs), and particularly, relates to a method for manufacturing a printed circuit board with a cavity.

2. Description of Related Art

To accommodate development of miniaturized electronic products with multiple functions, multilayer printed circuit boards are widely used due to their special characteristics such as micromation, lightness, and high-density interconnectiblity.

Many electronic elements need to be packaged on the PCB, in electronic communication with the electrically conductive traces of the PCB. In order to reduce packaging height, a cavity for receiving the electronic elements is formed when manufacturing the PCB. Some of the electrically conductive traces in an inner layer in the cavity are exposed. A method for manufacturing the PCB with cavity generally includes a step of laminating an adhesive sheet and an outer electrically conductive layer on an inner layer substrate having electrically conductive traces. The adhesive sheet is generally pre-preg. The pre-preg includes B-stage resin. When the pre-preg is heated and pressed, the resin in the pre-preg can flow and have an adhesive ability, thus the inner layer substrate and the outer electrically conductive layer are adhered by the adhesive sheet. When the adhesive sheet is hot pressed, the overflow of resin in the adhesive sheet is hard to control. The overflow of resin on the electrically conductive traces is hard to remove, such that the PCB with a cavity has to be discarded.

What is needed, therefore, is a method for manufacturing a printed circuit board with cavity to overcome the above-described problems.

BRIEF DESCRIPTION OF THE DRAWINGS

Many aspects of the present embodiment can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION

Embodiments are now described in detail below and with reference to the drawings.

Referring to FIGS. 1-9, a method for manufacturing a PCB provided in an illustrative embodiment includes the following steps.

Step 1: an inner substrate 110 is provided.

Figure 1:
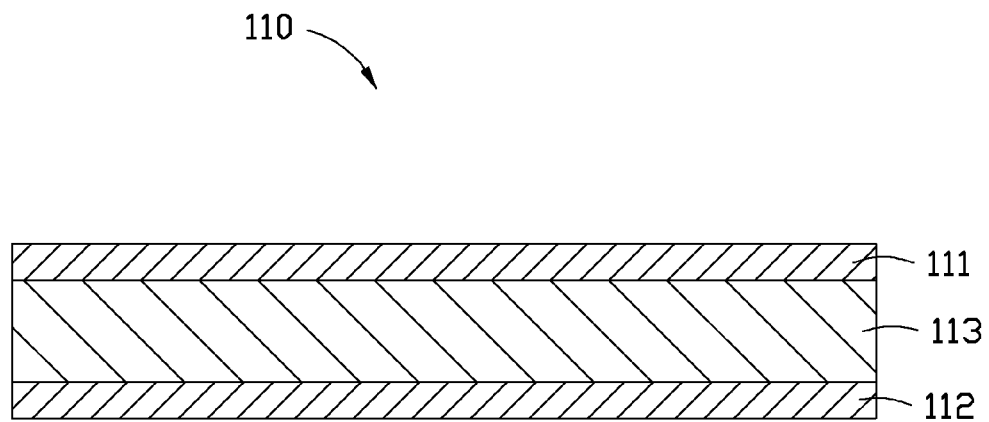
FIG. 1a is a cross-sectional view of an inner substrate including a first electrically conductive layer and a second electrically conductive layer in accordance with a first embodiment.

Referring to FIG. 1, in the illustrative embodiment, the inner substrate 110 is a double sided copper clad laminate. The inner substrate 110 includes a first electrically conductive layer 111, a second electrically conductive layer 112, and an insulating layer 113 sandwiched between the first electrically conductive layer 111 and the second electrically conductive layer 112.

Figure 2:
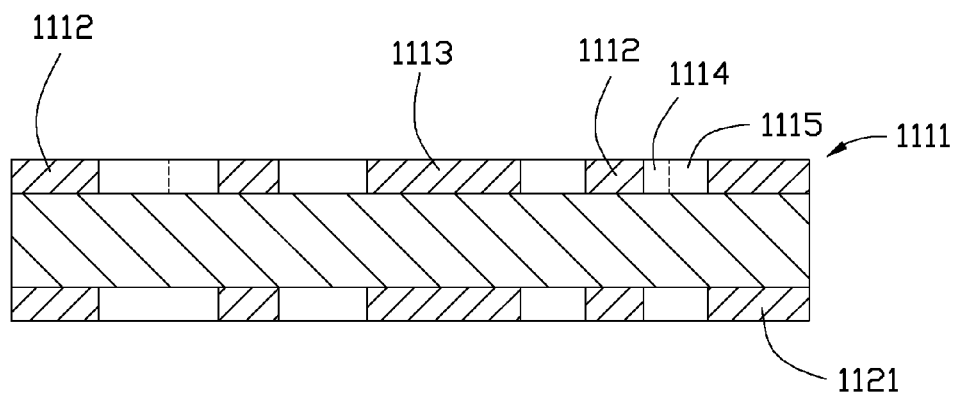
FIG. 2 is similar to FIG. 1, but shows a first electrically conductive pattern formed in the first electrically conductive layer and a second electrically conductive pattern formed in the second electrically conductive layer.
Figure 3:
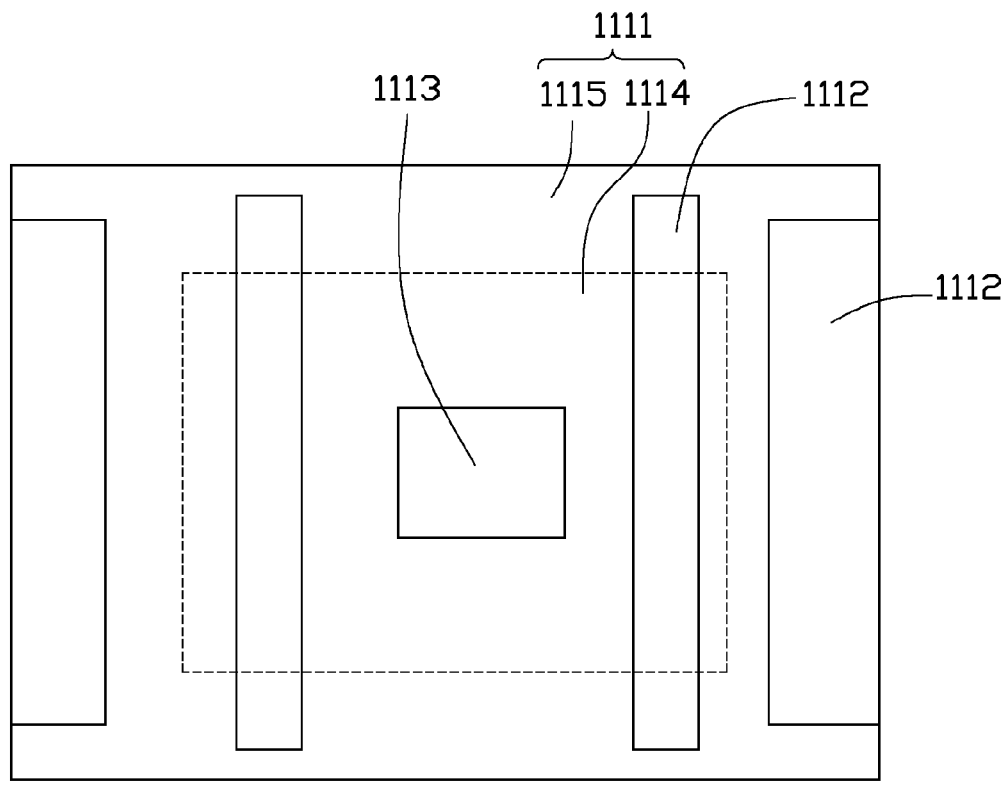
FIG. 3 is a plan view of the first electrically conductive pattern in the FIG. 2.

Step 2, referring to FIGS. 2 and 3, a first electrically conductive pattern 1111 is formed by removing part of the first electrically conductive layer 111, and a second electrically conductive pattern 1121 is formed by removing part of the second electrically conductive layer 112.

The first electrically conductive pattern 1111 and the second electrically conductive pattern 1121 may be formed by using a photolithography process and an etching process. The first electrically conductive pattern 1111 includes a number of electrically conductive traces 1112 and at least one pad 1113.

The first electrically conductive pattern 1111 includes an exposed region 1114 and an attaching region 1115 surrounding the exposed region 1114. The exposed region 1114 is used as a bottom portion of a cavity (i.e. a cavity 102) formed in the following steps. The attaching region 1115 of the first electrically conductive pattern 1111 will be laminated on an outer layer. Portions of the electrically conductive traces 1112 and the pad 103 are arranged in the exposed region 1114 of the first electrically conductive pattern 1111.

Figure 4:
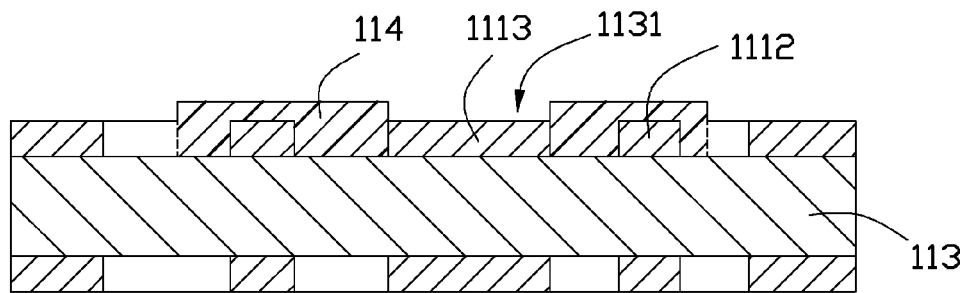
FIG. 4 is similar to FIG. 2, but shows a solder mask layer formed on the first electrically conductive pattern corresponding to an exposed region of the first electrically conductive pattern.

Step 3, referring to FIG. 4, a solder mask layer 114 is formed on a surface of the first electrically conductive traces 1112 and a surface of the insulating layer 113 in the exposed region 1114. At least one opening 1131 is defined in the solder mask layer 114. The at least one pad 1113 is exposed to the opening 1131. The solder mask layer 114 may be formed by printing and baking liquid solder resist on the first electrically conductive pattern 1111 and the insulating layer 113. The solder mask layer 114 is configured for covering and protecting the first electrically conductive traces 1112 in the exposed region 1114.

It can be understood, when there are no first electrically conductive traces 1112 arranged in the exposed region 1114, the step of forming the solder mask layer 114 may be omitted.

Figure 5:
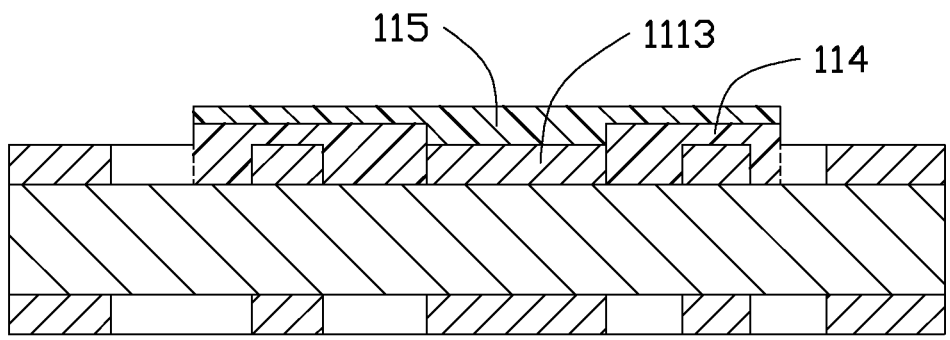
FIG. 5 is similar to FIG. 4, but shows a protective layer formed on a surface of the solder mask layer and a surface of a pad in the exposed region of the first electrically conductive pattern.

Step 4, referring to FIG. 5, a protective layer 115 is formed over the entire exposed region 1114.

The protective layer 115 is adhered to the surface of the solder mask layer 114 and the surface of pad 1113 for protecting the pad 1113 from being corroded by a reagent in a hereafter process. The protective layer 115 is a removable layer. The protective layer 115 may be made of peelable thermally curable printing ink or a photo resist ink. The protective layer 115 should have enough mechanical strength, heat resistance, and be acid and alkali resistant. A softening point of the protective layer 115 is higher than 200. The protective layer 115 can bear a pressure force larger than 25 kg/cm$^2$.

In one embodiment, the protective layer 115 made of peelable thermally curable printing ink can be formed by a method described as follows. Liquid peelable thermally curable printing ink is applied onto the entire surface of the pad 113 and the entire surface of the solder mask layer 114. Then the liquid thermally curable printing ink is cured by using a baking process, thereby obtaining the protective layer 115. A model of the liquid thermally curable printing ink may be LM-600 PSMS. In an alternative embodiment, the protective layer 115 made of photo resist ink can be formed by a method described as follows. Photo resist ink is applied onto the entire surface of the pad 113 and the entire surface of the solder mask layer 114. Then portions of the photo resist ink is cured by using an exposing process, thereby obtaining the protective layer 115. A model of the photo resist ink may be PR 2000SA.

Figure 6:
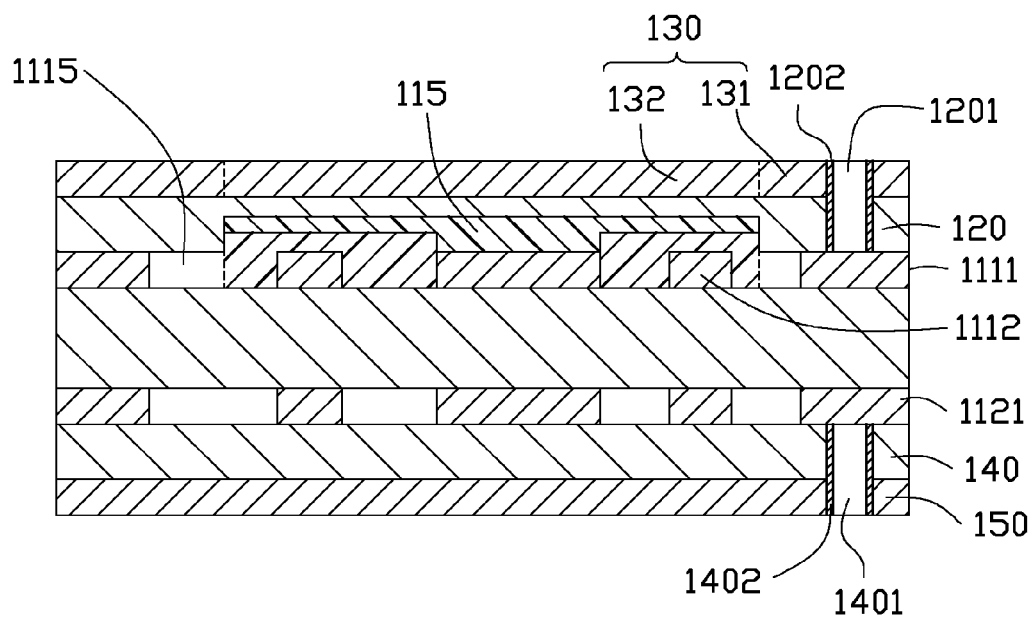
FIG. 6 is similar to FIG. 5, but shows a first adhesive layer, a third electrically conductive layer laminated on the first electrically conductive pattern, a second adhesive layer, a fourth electrically conductive layer laminated on the second electrically conductive pattern, a first plated via formed in the first adhesive layer, a third electrically conductive layer, a second plated via formed in the second adhesive layer and the fourth electrically conductive layer.
Figure 7:
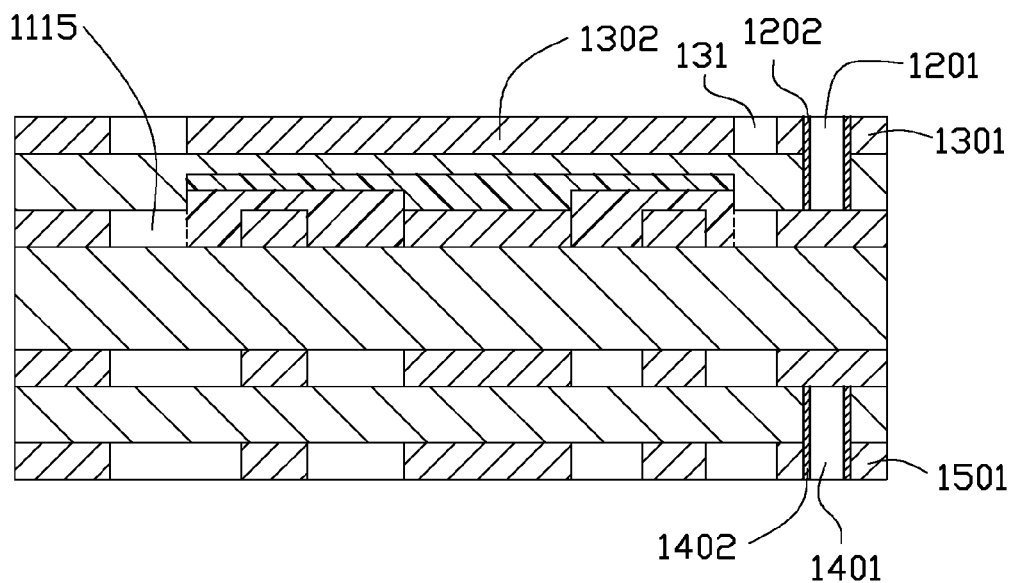
FIG. 7 is similar to FIG. 6, but shows a third electrically conductive pattern formed in the third electrically conductive layer and a fourth electrically conductive pattern formed in the fourth electrically conductive layer.

Step 5, referring to FIGS. 6 and 7, a first adhesive layer 120 is formed on the of the attaching region 1115 of first electrically conductive traces 1112 and the protective layer 115, and a third electrically conductive layer 130 is formed on the first adhesive layer 120. A second adhesive layer 140 is formed on the second electrically conductive pattern 1121, and a fourth electrically conductive layer 150 is formed on the second adhesive layer 140. The third electrically conductive layer 130 includes a first region 131 and a second region 132. An arrangement of the first region 131 and the second region 132 is similar to that of the attaching region 1115 and the exposed region 1114. The first region 131 surrounds the second region 132. The first region 131 is superposed on the attaching region 1115 of the first electrically conductive pattern 1111. The second region 132 is superposed on the exposed region 1114 of the first electrically conductive pattern 1111. A third electrically conductive pattern 1301 is formed by removing part of the third electrically conductive layer 130 in the first region 131, and a fourth electrically conductive pattern 1501 is formed by removing part of the fourth electrically conductive layer 150.

Prior to forming the first adhesive layer 120 and the second adhesive layer 140, the surface of the first electrically conductive traces 1112 and the surface of the second electrically conductive pattern 1121 can be roughened by brown oxide treatment or black oxide treatment.

Figure 8:
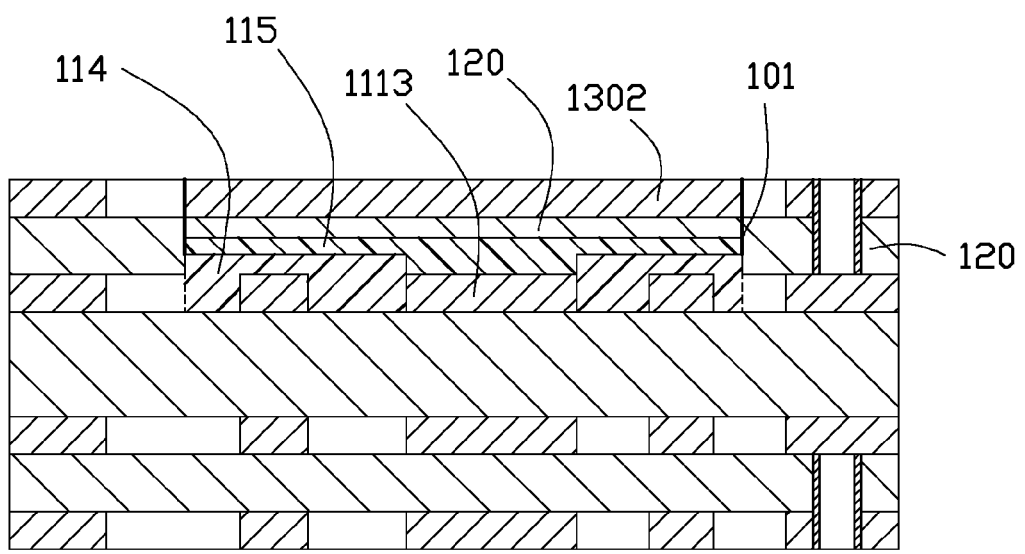
FIG. 8 is similar to FIG. 7, but shows a slit defined in the first adhesive layer and a third electrically conductive layer along a boundary of the exposed region.

In one embodiment, referring to FIGS. 7 and 8, prior to forming the third electrically conductive pattern 1301 and the fourth electrically pattern 1501, a number of first plated vias 1201 are defined in the first adhesive layer 120 and the third electrically conductive layer 130 in the first region 131 and a number of second plated vias 1401 are defined in the second adhesive layer 140 and the fourth electrically conductive layer 150. A first plating metal layer 1202 in each of the first plated vias 1201 are electrically connected with the first electrically conductive pattern 1111 and the third electrically conductive layer 130. A second plating metal layer 1402 in each of the second plated vias 1401 is electrically connected with the second electrically conductive pattern 1121 and the fourth electrically conductive layer 150. After the third electrically conductive pattern 1301 and the fourth electrically pattern 1501 are formed, the first plating metal layer 1202 is in electric communication with the first electrically conductive pattern 1111 and the third electrically conductive pattern 1131. The second plating metal layer 1402 is in electric communication with the second electrically conductive pattern 1121 and the fourth electrically conductive pattern 1501.

The first adhesive layer 120 and the second adhesive layer 140 may be pre-preg. The third electrically conductive layer 130 and the fourth electrically conductive layer 150 may be copper foils. The third electrically conductive pattern 1301 and the fourth electrically conductive pattern 1501 are formed using a photolithography process and an etching process. The third electrically conductive layer 130 of the second region 132 is remaining to form an alignment mask 1302. Part of the third electrically conductive layer 130 between the third electrically conductive pattern 1301 and the alignment mask 1302 is removed.

Figure 9:
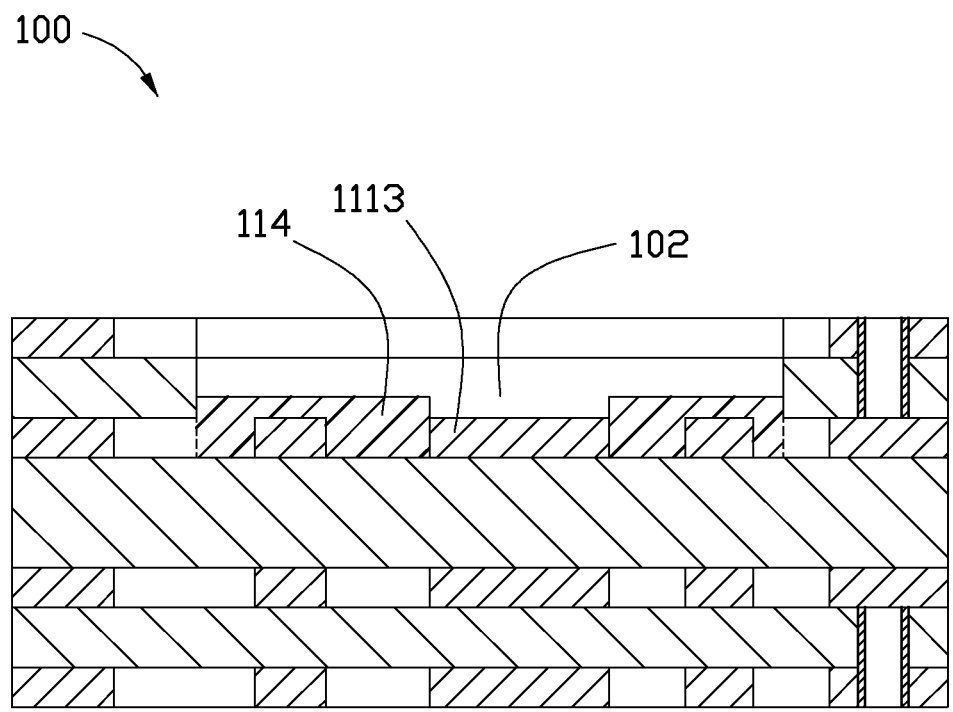
FIG. 9 is similar to FIG. 8, but shows the first adhesive layer partly removed, the third electrically conductive layer partly removed, and the protective layer partly removed.

Step 6, referring to FIGS. 8 and 9, a slit 101 is defined in the first adhesive layer 120 along the boundary between the exposed region 1114 and the attaching region 1115. The third electrically conductive layer 130, the first adhesive layer 120 and the protective layer 115 in the exposed region 1114 surrounded by the slit 101 is removed along the slit 101, thereby forming a cavity 102 and exposing the pad 1113 to the cavity 102.

The slit 101 is formed by using a laser cutting process or a punching process. The slit 101 is defined along a boundary of the exposed region 1115. In the illuminated embodiment, the slit 101 is formed along the boundary of the alignment mask 1302 and only passes through the first adhesive layer 120. When part of the third electrically conductive pattern 1301 along the boundary of the exposed region 1115 remains, the slit 101 needs to pass through the third electrically conductive layer 130 and the first adhesive layer 120. One surface of the first adhesive layer 120 adheres to the protective layer 115, an opposite surface of the adhesive layer 120 adheres to the alignment mask 1302. A material of the protective layer 115 is different from that of the alignment mask 1302. An adhesive force between the first adhesive layer 120 and the protective layer 115 is smaller than that between the first adhesive layer 120 and the alignment mask 1302, such that the alignment mask 1302 and the first adhesive layer 120 can be peeled from the surface of protective layer 115 together. The first adhesive layer 120 is isolated from the first electrically conductive pattern 111 in the exposed region 1114 by the protective layer 115 when removing the adhesive layer 120, thus the first electrically conductive pattern 111 in the exposed region 1114 will not be affected when forming the adhesive layer 120.

The protective layer 115 is removed after the adhesive layer 120 is removed, thus the cavity 102 for receiving electrical elements is formed. According to different materials of the protective layer 115, methods for removing the protective layer 115 can also be different. When the protective layer 115 is made of peelable thermally curable printing ink, the protective layer 115 can be removed by peeling. When the protective layer 115 is made of photo resist ink, the protective layer 115 can be removed by striping in a corresponding reagent. In the striping process, a chemical reaction will occur between the reagent and the protective layer 115, such that the protective layer 115 is dissolved and is separated from the surface of the first electrically conductive pattern 111 and the solder mask layer 114.

It is believed that the present embodiments and their advantages will be understood from the foregoing description, and it will be apparent that various changes may be made thereto without departing from the spirit and scope of the disclosure or sacrificing all of its material advantages, the examples herein before described merely being preferred or exemplary embodiments of the disclosure.

The invention claimed is:

1. A method for manufacturing printed circuit board, comprising:
   providing an inner substrate including a first electrically conductive layer;
   forming a first electrically conductive pattern in the first electrically conductive layer, the first electrically conductive pattern comprising an exposed region spatially corresponding to a cavity to be formed and an attaching region surrounding the exposed region;
   printing and curing ink material on the first electrically conductive pattern over the entire exposed region to form a protective layer;
   laminating a first adhesive layer on the attaching region of the first electrically conductive pattern and the protective layer;
   laminating a second electrically conductive layer on the first adhesive layer, the second electrically conductive layer comprising a first region superposing on the attaching region and a second region superposing on the exposed region;
   forming a second electrically conductive pattern in the first region of the second electrically conductive layer;
   defining a slit along a boundary between the exposed region and the attaching region the slit passing through the second electrically conductive layer and the first adhesive layer, and
   removing portions of the second electrically conductive layer, the first adhesive layer and the protective layer surrounded by the slit to form the cavity.

2. The method as claimed in claim 1, wherein the first electrically conductive pattern comprises a plurality of first electrically conductive traces and at least one pad, portions of the first electrically conductive traces and the at least one pad are arranged in the exposed region.

3. The method as claimed in claim 2, further comprising a step of forming a solder mask layer on the exposed region of the first electrically conductive pattern prior to forming the protective layer, wherein the solder mask layer covers the portion of the first electrically conductive traces in the exposed region, at least one opening is defined in the solder mask layer, the at least one pad is exposed through the corresponding opening, the protective layer is formed on the surface of the pad and the solder mask layer.

4. The method as claimed in claim 1, wherein the protective layer is formed by printing and curing a peelable thermally curable printing ink on the first electrically conductive pattern in entire exposed region, and the protective layer is removed by peeling-off the peelable thermally curable printing ink.

5. The method as claimed in claim 1, wherein the protective layer is formed by forming a photo resist ink on the first electrically conductive pattern in entire exposed region, and the protective layer is removed by a striping process.

6. The method as claimed in claim 5, wherein the photoresist ink is cured by using an exposing process.

7. The method as claimed in claim 1, further comprising a step of forming at least one first plated via in the second electrically layer in the first region and the first adhesive layer prior to forming a second electrically conductive pattern in the second electrically conductive layer, a plated metal layer being formed in each first plated via, the first electrically conductive pattern electrically connected with the second electrically conductive pattern by the plated metal layer.

8. The method as claimed in claim 1, wherein an alignment mask is formed in the second electrically conductive layer in the second region when the second electrically conductive pattern is formed, and the alignment mask is configured for achieving alignment of the slit with the boundary between the exposed region and the attaching region when forming the slit.

9. The method as claimed in claim 8, further comprising a step of roughening the surface of the first electrically conductive pattern prior to laminating the first adhesive layer and the second electrically conductive layer on the attaching region of the first electrically conductive pattern and the protective layer.

10. The method as claimed in claim 9, wherein the surface of the first electrically conductive pattern is roughened by a brown oxide treatment or a black oxide treatment.

* * * * *